(12) United States Patent
Labbe et al.

(10) Patent No.: US 10,886,847 B1
(45) Date of Patent: Jan. 5, 2021

(54) PERFORMANCE REGULATION TECHNIQUES

(71) Applicant: Arm Limited, Cambridge (GB)

(72) Inventors: Benoit Labbe, Cambridge (GB);
Graham Peter Knight, Cambridge (GB); Philex Ming-Yan Fan, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/441,228

(22) Filed: Jun. 14, 2019

(51) Int. Cl.
| | |
|---|---|
| *H02M 3/157* | (2006.01) |
| *G04F 10/00* | (2006.01) |
| *H02M 3/158* | (2006.01) |
| *H02M 1/00* | (2006.01) |

(52) U.S. Cl.
CPC .......... *H02M 3/157* (2013.01); *G04F 10/005* (2013.01); *H02M 3/158* (2013.01); *H02M 2001/0025* (2013.01)

(58) Field of Classification Search
CPC ...... H02M 3/157; H02M 3/158; G04F 10/005
USPC ......................................... 323/241, 283–285
See application file for complete search history.

(56) References Cited

U.S. PATENT DOCUMENTS

| | | | | |
|---|---|---|---|---|
| 2008/0180299 A1* | 7/2008 | Forejt | ................... | G04F 10/005 341/166 |
| 2010/0134083 A1* | 6/2010 | Trescases | .............. | G04F 10/005 323/283 |
| 2010/0295590 A1* | 11/2010 | Yoshihara | ............. | G04F 10/005 327/265 |
| 2013/0214959 A1* | 8/2013 | Lee | ......................... | H03M 1/50 341/166 |
| 2015/0115925 A1* | 4/2015 | Teh | ....................... | H03M 1/068 323/283 |
| 2017/0163152 A1* | 6/2017 | Holzmann | .............. | G05F 1/462 |

FOREIGN PATENT DOCUMENTS

WO 2015-161890 A1 10/2015

OTHER PUBLICATIONS

PCT International Search Report and Written Opinion; PCT/GB2020/050629; dated Jun. 15, 2020.
Shang, et al.; Low Overhead and Fast Reaction Adaptive Clocking System for Voltage Droop Tolerance; Chinese Journal of Electronics; vol. 28, No. 3; May 2009 DOI: 10.1049/cje.2019.02.009.

* cited by examiner

*Primary Examiner* — Gary A Nash

(74) *Attorney, Agent, or Firm* — Pramudji Law Group PLLC; Ari Pramudji

(57) ABSTRACT

Various implementations described herein are directed to a device having a voltage regulator that uses a modulator to adjust an output voltage. The device may include a time-to-digital converter that measures a timing delay of a logic chain, compares the timing delay to a reference delay to determine a timing delay error, and provides the timing delay error to the modulator for adjusting the output voltage.

25 Claims, 8 Drawing Sheets

PERFORMANCE REGULATION TECHNIQUES

STATEMENT AS TO FEDERALLY-SPONSORED RESEARCH

This invention was made with Government support under Agreement No. HR0011-17-9-0025, awarded by DARPA. The Government has certain rights in the invention.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

The performance of a digital circuit is typically dependent on supply voltage, process variation and temperature. Conventional digitally controlled DC-to-DC converters typically use an analog-to-digital converter (ADC) to convert an output voltage into a digital feedback signal that is compared against a reference signal to set a desired voltage level for the output voltage. Conventional systems generate the reference voltage based on a desired performance level of the digital circuit. However, conventional approaches need some voltage margin between the output voltage and a maximum clock frequency of the digital system. This voltage margin may account for sensor errors and dynamic regulation of DC voltage drops across power-delivery networks of the digital system. In addition, this voltage margin may result in additional power dissipation as the supply voltage of the digital system is higher than necessary and increases leakage power along with dynamic power dissipated by the digital system with little to no performance benefit.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to control architecture for implementing performance regulation schemes and techniques. For instance, various implementations described herein provide for control architecture for implementing ultra-low power buck converter circuitry for Internet-of-Things (IoT) node sensors. The control architecture utilizes a time-to-digital (TDC) converter along with a buck converter, which may refer to a DC-to-DC converter capable of step-down conversion. Also, the control architecture may utilize various clock scaling techniques in a supply loop.

The control architecture described herein provides for performance regulation while keeping a control quiescent current low. The control architecture described herein uses a time-to-digital converter (TDC) to determine a performance delay of a digital chain that is measured at regular intervals and compared against a reference delay. From this comparison, a delay error may be determined and used to feed a modulator adapted to adjust output voltage provided to a load. For instance, if propagation delay is too long, the TDC may raise an output voltage provided to the load, and if the propagation delay is too short, then the TDC may lower the output voltage provided to the load.

Generally, performance regulation (PR) rather than voltage regulation (VR) has become more essential for ultra-low power systems where energy per cycle figures of a digital subsystem is more important than absolute maximum performance figures. One unfortunate characteristic of energy per cycle figures of a digital system is that its optimum point may occur near a device threshold voltage, and this is where CMOS transistors may be more sensitive to process and temperature variations.

Various implementations of performance regulation schemes and techniques will now be described in greater detail herein with reference to FIGS. 1A-4B.

Figure 1A:
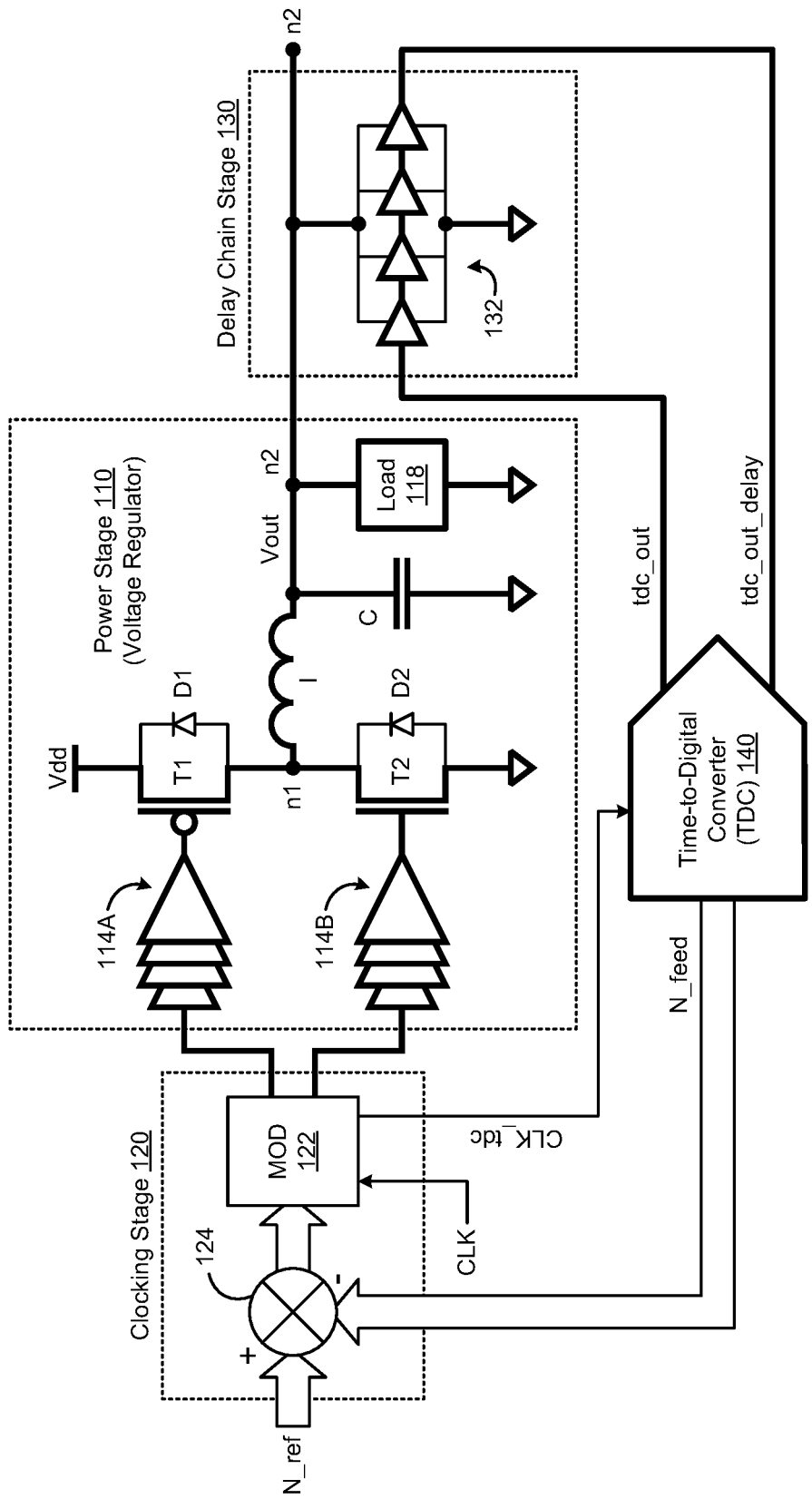
FIGS. 1A-1B illustrate various diagrams of performance regulation circuitry in accordance with implementations described herein.
Figure 1B:
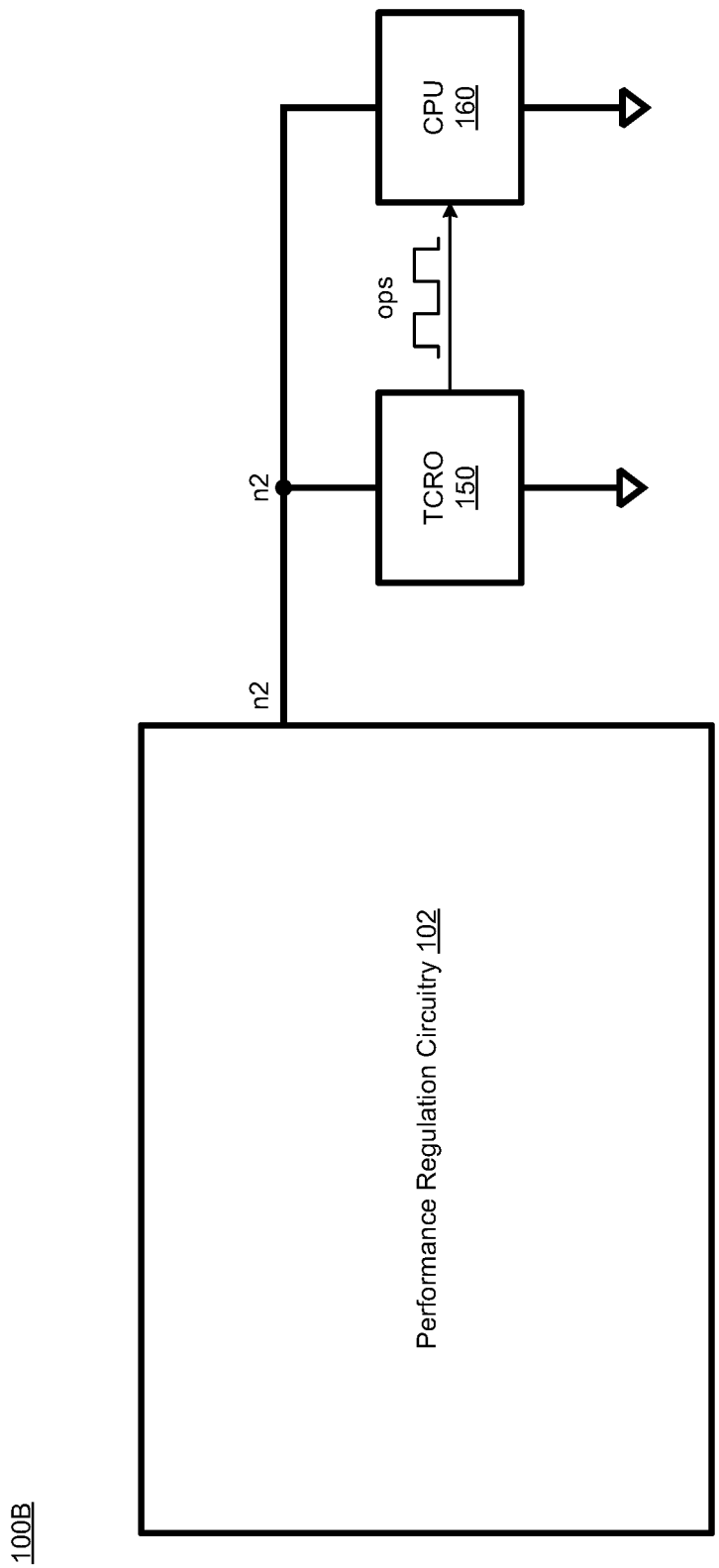

FIGS. 1A-1B illustrate various diagrams of performance regulation circuitry in accordance with implementations described herein. In particular, FIG. 1A illustrates a diagram 100A of performance regulation circuitry 102, and FIG. 1B illustrates another diagram 100B of performance regulation circuitry 102 coupled to a tuned clock ring oscillator (TCRO) 150 and a central processing unit (CPU) 160.

As shown in reference to FIG. 1A, the performance regulation circuitry 102 is a device having multiple stages, including, e.g., a power stage 110, a clocking stage 120, a delay chain stage 130, and a time-to digital converter (TDC) stage 140. In some instances, the performance regulation circuitry 102 may be implemented as a system of various circuit components that are arranged and coupled together as an assemblage or combination of parts that form a circuit structure. Also, in some instances, a method of performance regulation may involve use of various circuit components to implement the various performance regulation schemes and techniques described herein.

The power stage 110 may be implemented as a voltage regulator that uses a modulator (MOD 122) to adjust an output voltage (Vout). In some instances, the voltage regulator 110 may be coupled to a load 118 so as to provide and regulate a supply voltage (e.g., Vdd) of the load 118, and the voltage regulator 110 may refer to a DC-to-DC voltage converter or buck converter. The voltage regulator 110 may include first power inverters 114A and second power inverters 114B that are coupled in parallel between the modulator (MOD 122) and gates of power transistors (T1, T2). As shown, the first power inverters 114A may be coupled between the modulator (MOD 122) and a first power transistor (T1), and the second power inverters 114B may be coupled between the modulator (MOD 122) and a second power transistor (T2). The power transistors (T1, T2) are coupled in series between a voltage supply (Vdd) and ground (or Vss). Also, the voltage regulator 110 may include a first diode (D1) that is coupled in parallel with the first power transistor (T1), and a second diode (D2) that is coupled in parallel with the second power transistor (T2). The voltage regulator 110 may also include a power coil, such as, e.g., an inductor (I), that is coupled between the power transistors (T1, T2) at node (n1) and the load at node (n2). The voltage regulator 110 may include a charge storage device, such as, e.g., a capacitor (C), that is coupled between the node (n2) and ground (or Vss). In some instances, the load 118 may be coupled between the node (n2) and ground (or Vss), and the load 118 may receive the output voltage (Vout) via the node (n2).

The clocking stage 120 may include a modulator (MOD 122) and combinational logic 124. The modulator (MOD 122) may use the combinational logic 124 to compare a feedback signal (N_feed) to a reference signal (N_ref) and also determine a difference between the feedback signal (N_feed) and the reference signal (N_ref). In some cases, the combinational logic 124 may include logic associated with computational or arithmetic operations (e.g., difference and/or addition of inputs). The combinational logic 124 may receive the feedback signal (N_feed) from the TDC 140, receive an external reference signal (N_ref), and provide an output signal to the modulator (MOD 122). The modulator (MOD 122) may receive an input clock signal (CLK) and provide an output clock signal (CLK_tdc) that may be used as a sampling clock signal.

The delay chain stage 130 may include a logic chain 132 that provides a delay signal (tdc_out_delay) associated with a signal (tdc_out) passing through the logic chain 132. In some instances, the logic chain 132 may be configured to sense process variation of circuit components associated with the performance regulation circuitry 102. The logic chain 132 may include an inverter logic chain (e.g., series coupled inverters operating as a ring oscillator) that provides for determining performance of the load 118. As shown, the logic chain 132 may be coupled between the node (n2) and ground (or Vss), and the logic chain 132 may receive the output voltage (Vout) at the node (n2). The output voltage (Vout) may be provided to power supply inputs of the inverters in the delay chain 132.

The time-to digital converter (TDC) stage 140 may be configured to measure a timing delay of the delay signal (tdc_out_delay) from the logic chain 132, compare the timing delay to a reference delay to determine a timing delay error, and provide the timing delay error to the modulator (MOD 122) via the logic 124 for adjusting the output voltage (Vout). The time-to-digital converter (TDC) 140 may provide the timing delay error as a feedback signal (N_feed) to the modulator (MOD 122) via the logic 124 for adjustment of the output voltage (Vout) based on the timing delay error. For instance, if the timing delay error is greater than a predetermined interval, then the time-to-digital converter (TDC) 140 may provide the feedback signal (N_feed) to the modulator (MOD 122) to increase the output voltage (Vout). The TDC 140 may receive the output clock signal (CLK_tdc) as a sampling clock signal from the modulator (MOD 122), and the TDC 140 may generate the feedback signal (N_feed) based on the sampling clock signal (CLK_tdc) from the modulator (MOD 122) and/or the delay signal (tdc_out_delay) from the delay chain 132.

The time-to-digital converter (TDC) 140 may measure (or sample) the timing delay of the logic chain 132 at periodic timing intervals. In some instances, if the timing delay error is greater than a predetermined interval, then the time-to-digital converter (TDC) 140 may provide the timing delay error to the modulator (MOD 122) to increase the output voltage (Vout). Otherwise, if the timing delay error is less than the predetermined interval, then the time-to-digital converter (TDC) 140 may provide the timing delay error to the modulator (MOD 122) to decrease the output voltage (Vout).

As shown in reference to FIG. 1B, the performance regulation circuitry 102 is a device that is coupled to the tuned clock ring oscillator (TCRO) 150 and the central processing unit (CPU) 160. In some instances, the TCRO 150 and the CPU 160 may be coupled between the node (n2) and ground (or Vss), and the TCRO 150 may provide an output pulse signal (ops) to the CPU 160 that is independent of the delay signal (tdc_out_delay) provided by the delay chain 132. The output pulse signal (ops) may serve as a clock signal for operation of the CPU 160

In some implementations, the measured delay chain 132 may be coupled with the main CPU clock generation circuit (e.g., TCRO 150), which allows a high performance mode with a small margin only for the transient response of the voltage regulator 110 and a minimum phase noise for the CPU clock (ops). The CPU 160 may work at a constant frequency and desired performance at the cost of a slightly sub-optimal energy per cycle characteristic. If the energy per cycle performance is preferred over a tight control of the CPU clock (ops), then the delay chain 132 may be coupled tightly with the ring oscillator 150 that generates the CPU clock (ops).

The bandwidth and aliasing characteristic of the voltage regulator 110 may be defined by setting its sampling clock (CLK_tdc) independent of the CPU clock (ops). This control architecture may not necessitate the need for incorporation of a process monitor or a temperature sensor as performance of the digital gates may be measured directly by the TDC 140. In some instances, the TDC power consumption may be lower than ADC power consumption (as used by conventional techniques) especially at low sampling clock rates, as there may be no need for a precise always-on voltage reference circuit. Instead, an RC-based time reference may use an ultra-low quiescent current.

Figure 2A:
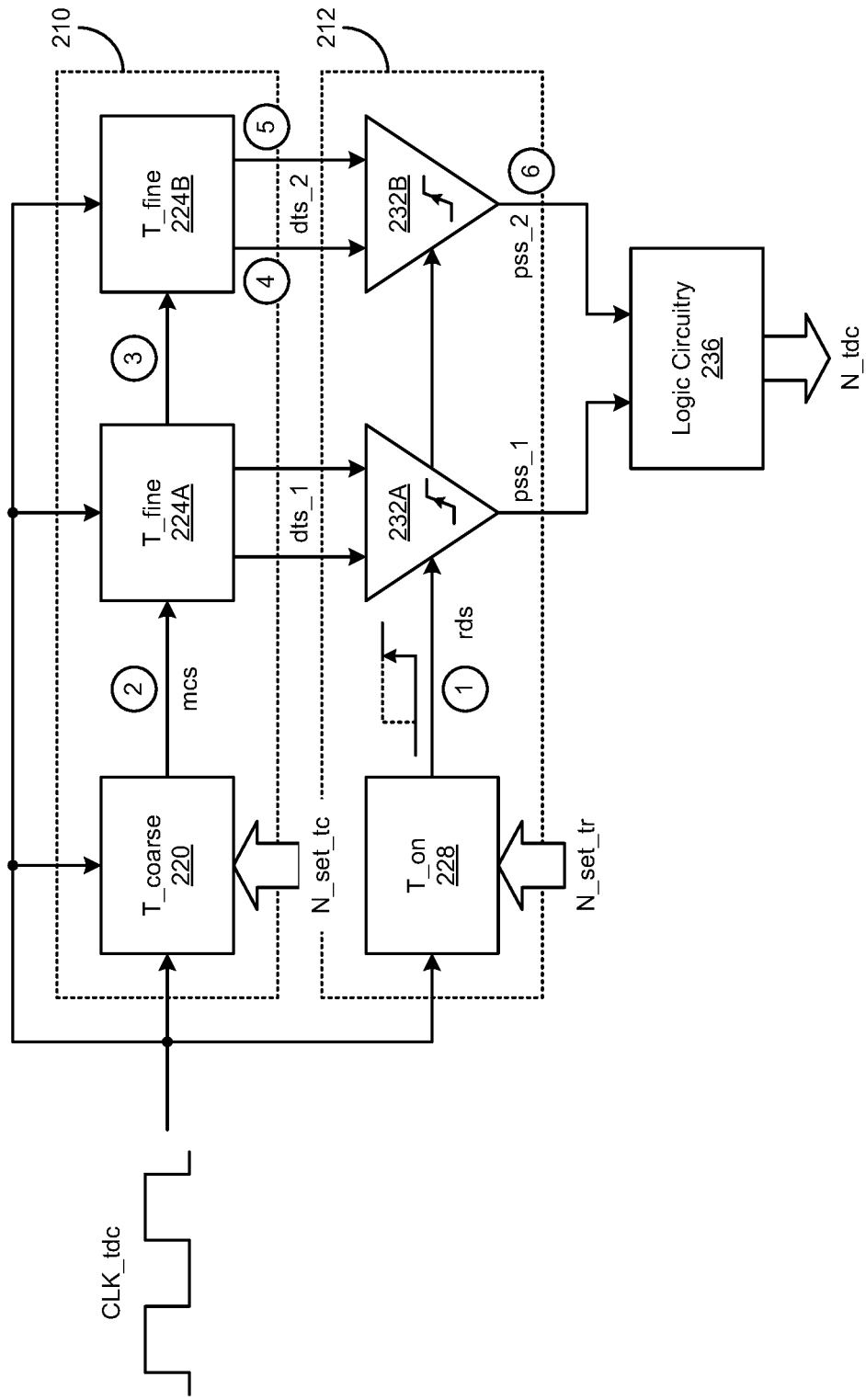
FIGS. 2A-2B illustrate diagrams related to a time-to-delay converter (TDC) in accordance with implementations described herein.
Figure 2B:
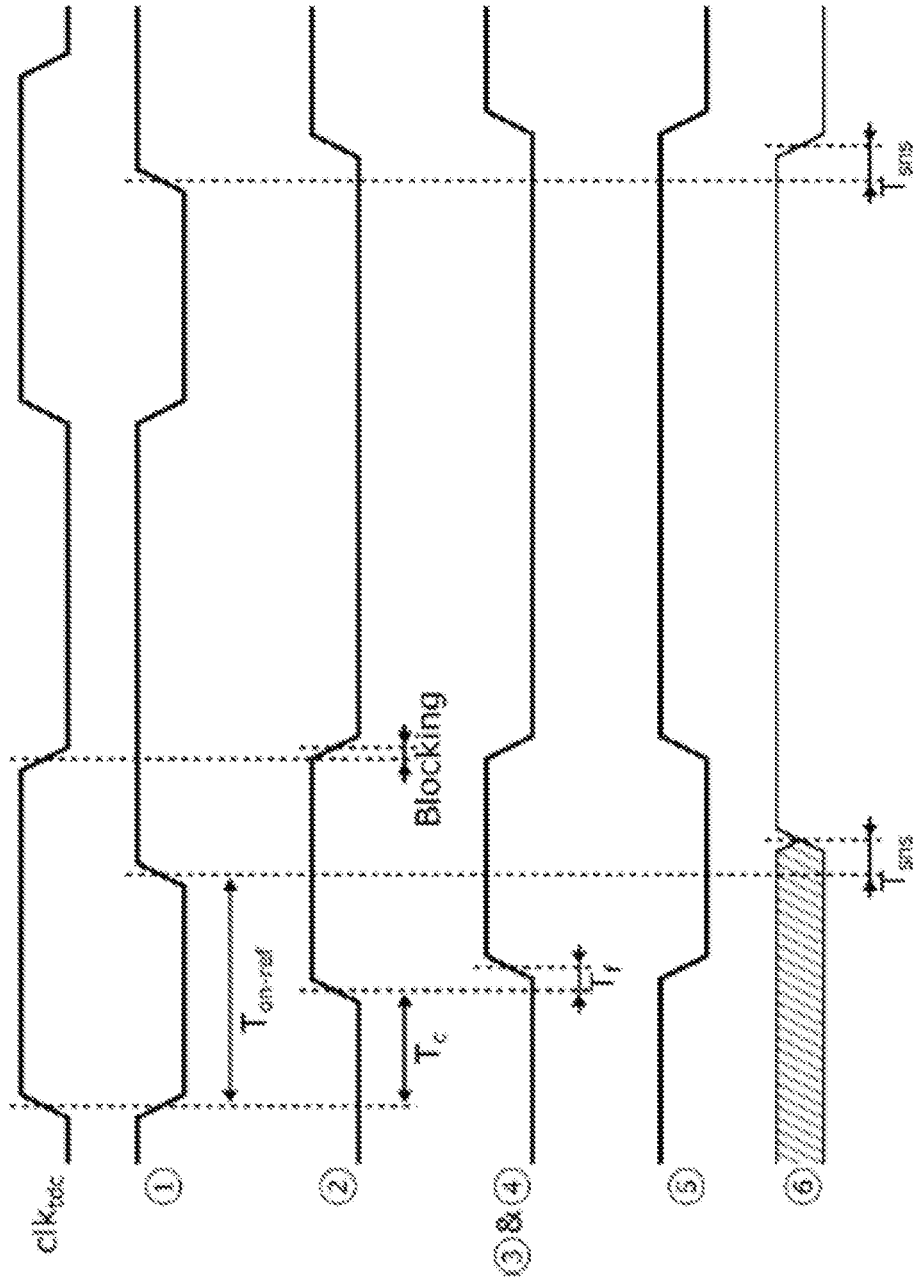

FIGS. 2A-2B illustrate diagrams related to a time-to-delay converter (TDC) in accordance with implementations described herein. In particular, FIG. 2A illustrates a diagram 200A related to the time-to-delay converter (TDC) 140, and FIG. 2B illustrates a waveform diagram 200B related to operation of the TDC 140.

As shown in reference to FIG. 2A, the time-to-delay converter (TDC) 140 is a device having multiple components, including, e.g., delay circuitry 210, latching circuitry 212, and logic circuitry 236. In some instances, the delay circuitry 210 receives the clock signal (e.g., CLK_tdc) and provides differential timing signals (dts_1, dts_2) to the latching circuitry 212. The delay circuitry 210 may include multiple components, including, e.g., one or more coarse delays 220 and one or more fine delays 224A, 224B.

In some instances, the delay circuitry 210 may be coupled to a logic chain (e.g., the logic chain 132 of FIG. 1A) so as to receive a timing delay signal (N_set_tc) from the logic chain as a timing delay related to performance of the logic chain 132. In some instances, the timing delay signal (N_set_tc) may refer to the delay signal (tdc_out_delay) associated with the signal (tdc_out) passing through the logic chain 132, as described herein above in reference to FIG. 1A.

The latching circuitry 212 receives the differential timing signals (dts_1, dts_2) from the delay circuitry and provides pulse sensing signals (pss_1, pss_2) when activated (or triggered) by a reference delay signal (rds). The latching circuitry 212 may include multiple components, including, e.g., a timing reference 228 and one or more latches 232A, 232B. In some instances, the timing reference 228 may refer to triggering circuitry that receives the clock signal (CLK_tdc) and activates the one or more latches 232A, 232B by providing a timing reference signal, such as, e.g., the reference delay signal (rds), to a power supply input of the one or more latches 232A, 232B. In some instances, the one or more latches 232A, 232B may refer to one or more latch based sense amplifiers that are adapted to receive the differential timing signals (dts_1, dts_2) from the delay circuitry 210 and provide the pulse sensing signals (pss_1, pss_2) when activated.

The logic circuitry 236 receives the pulse sensing signals (pss_1, pss_2) from the latching circuitry 212 and provides the output signal (e.g., N_tdc) as a timing delay error. In some instances, the output signal (N_tdc) may be implemented as the feedback signal (N_feed) in FIG. 1A. The logic circuitry 236 may include one or more logic gates, such as, e.g., one or more AND gates, or similar.

The one or more coarse delays 220 (T_coarse) may receive the clock signal (CLK_tdc) from the modulator (MOD 122), receive the timing delay signal (N_set_tc) from the delay chain 140, and provide a modified clock signal (mcs) having a shorter pulse width. The one or more coarse delays 220 (T_coarse) provide a first delay stage within the time-to-delay (TDC) converter 140. The one or more coarse delays 220 (T-coarse) are described in greater detail herein below in reference to FIGS. 3B-3C.

The one or more fine delays 224A, 224B (T_fine) may receive the clock signal (CLK_tdc) from the modulator (MOD 122), receive the modified clock signal (mcs) having a shorter pulse width from the one or more coarse delays 220, and provide the differential timing signals (dts_1, dts_2) to the one or more latches 232A, 232B. In some instances, a first fine delay 224A receives the clock signal (CLK_tdc) from the modulator (MOD 122), receives the modified clock signal (mcs) from the coarse delay 220, and provides first differential timing signals (dts_1) to a first latch 232A. Also, a second fine delay 224B receives the clock signal (CLK_tdc) from the modulator (MOD 122), receives the modified clock signal (mcs) from the first fine delay 224A, and provides second differential timing signals (dts_2) to a second latch 232B. The first latch 232A provides a first pulse sensing signal (pss_1) to the logic circuitry 236, and the second latch 232B provides a second pulse sensing signal (pss_2) to the logic circuitry 236. The one or more fine delays 224A, 224B (T_fine) provide a secondary delay stage within the time-to-delay (TDC) converter 140. The one or more fine delays 224A, 224B (T-fine) are described in greater detail herein below in reference to FIG. 3A.

The timing reference 228 (or triggering circuitry: T_on) may receive the clock signal (CLK_tdc) from the modulator (MOD 122), receive the reference delay signal (N_set_tr) as a triggering signal, and provide the reference delay signal (rds) to the one or more latches 232A, 232B. In some instances, the reference delay signal (rds) may be used as an enable signal to activate or trigger the one or more latches 232A, 232B.

The logic circuitry 236 may receive the pulse sensing signals (pss_1, pss_2) from the one or more latches 232A, 232B and provide the output signal (e.g., N_tdc) as a timing delay error. In some instances, the output signal (N_tdc) may be implemented as the feedback signal (N_feed) in FIG. 1A. The logic circuitry 236 may be implemented with one or more logic gates, such as, e.g., one or more AND gates, or similar.

In some implementations, the time-to-digital converter (TDC) 140 receives the timing delay signal (N_set_tc) from the logic chain 132, measures a timing delay of the logic chain 132 based on the timing delay signal (N_set_tc), and provides the timing delay error to the modulator (MOD 122) for adjusting an output voltage (Vout) from the voltage regulator 110. In this instances, the output signal (Vout) is used to trigger a conduction pattern for the voltage regulator 110 when the timing delay error is positive.

In some implementations, the TDC 140 receives the clock signal (CLK_tdc) and provides the output signal (e.g., N_tdc) as a timing delay error. In some instances, when the clock signal (CLK_tdc) is low, propagation of the clock signal (CLK_tdc) through the TDC 140 may be blocked (e.g., as shown in FIG. 2B) and the differential timing signals (dts_1, dts_2) from the delay circuitry 210 may be forced to a logic-low state (e.g., logic zero having a potential near ground or near 0V). In some instances, the output signal (N_tdc) may be implemented as the feedback signal (N_feed) in FIG. 1A.

In some implementations, the time-to-digital (TDC) architecture is provided in FIG. 2A, and the TDC 140 is built around a time reference (e.g., N_set_tr), coarse delay elements (T_coarse 220), an optional coarse delay selector (e.g., multiplexer M1 shown in FIG. 3C), one or more fine delay elements (e.g., T-fine 224A, 224B), and one or more sense amplifiers (e.g., latches 232A, 232B). This architecture of the TDC 140 differs from conventional time-to-digital converters as follows. For instance, the TDC 140 uses sense amplifiers (e.g., latches 232A, 232B), instead of conventional D-flops, which allows for operation with Vout voltages significantly lower than the control supply voltage (Vdd), and this is typically not possible with conventional time-to-digital converters. Also, the fine delay elements (e.g., T-fine 224A, 224B) may have a differential output characteristic, i.e. one output is low and the other is high, wherein one output may be an input (e.g., when using an inverter, wherein the input and the output of the inverter are the outputs of the cell). In another instance, the coarse delay and/or the fine delay may have a propagation blocking input. This may be used to avoid aliasing when TDC propagation delay is longer than a sampling period. This may occur when the TDC 140 works outside of the operating region of the CPU subsystem at low supply voltage, and in some cases, the fine delay may be used as a blocking mechanism. Also, the number of output bits may be low (e.g., 1 or 2), and for some operation modes, only one bit may be needed.

In some implementations, the TDC 140 may be modelled as a comparator that compares two durations such that the TDC output Ntdc follows the logic equation:

$$N_{TDC} = ((T_c + N_f T_f) \geq T_{on}),$$

where Nf is the number of fine delay elements.

In operation, the converter regulates the output voltage such as the propagation delay through the TDC equals the time reference:

$$T_c + N_f T_f \approx T_{on}$$

The clock system may be built using a ring oscillator (TCRO 150) that oscillates as a function of its supply voltage (e.g., Vout from the power converter 110), process and temperature. The oscillation frequency of the TCRO 150 may be described as a function of the propagation delay through the ring oscillator chain:

$$f_{TCRO} = \frac{1}{T_{TCRO}}$$

The TCRO delay chain and the TDC delay chain may be designed using similar gates and placement so that some matching may be assumed between the two delays:

$$K(T_c + N_f T_f) \approx T_{TCRO},$$

where K is defined by the design of both chains.

For instance, if the TCRO delay chain is built with multiple inverters (e.g., 81 inverters), and if the TDC delay chain also employs multiple inverters (e.g., 161 inverters), then K may be approximately 0.5. Also, in some cases, reorganizing the three previous equations may yield the converter performance regulation equation:

$$f_{TCRO} = \frac{1}{KT_{on}}$$

This equation shows that regulating the output voltage of the converter so that the TDC output is at its tripping point results in regulating the cpu clock frequency.

As shown in reference to FIG. 2B, the waveform diagram 200B is related to operation of the time-to-delay converter (TDC) 140 in FIG. 2A. The numbered signals 1-6 in FIG. 2A correspond to the numbered waveforms 1-6 in FIG. 2B. As such, the signals 1-6 shown in FIG. 2A are provided as waveforms 1-6 in the timing diagram 210 in FIG. 2B. In some instances, the TDC input clock (CLK_tdc) may serve as a clock signal and as a blocking signal. When CLK_tdc is low, propagation through the TDC 140 may be blocked, and output signals (2, 3, 4, 5) from the delay elements (220, 224A, 224B) may be forced low. The time reference signal (N_set_tr) may be triggered by the TDC clock signal (CLK_tdc), and a pulse (low pulse) may be generated with a value determined by a digital setting. The time reference signal (N_set_tr) may be designed to be process-voltage-temperature (PVT) independent. The TDC 140 may provide for an on-time signal (T_on: 1) of the clock to be as long or longer than the time reference pulse (N_set_tr).

Also, in some instances, once the reference time pulse (N_set_tr) has elapsed, the sense amplifiers (e.g., latches 232A, 232B) may be triggered. The latch-based sense amplifiers (e.g., latches 232A, 232B) allow for a much lower operating voltage than using traditional D-flops. In reference to signal 1, shortly after a rising edge of the time reference signal (N_set_tr), the sense amplifier (e.g., latches 232A, 232B) output results (at signal 6) settle and propagates through the combinatory logic 236 that encodes it.

Figure 3A:
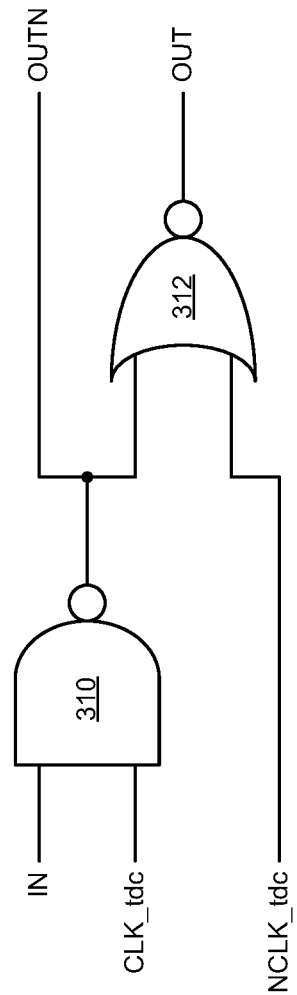
FIGS. 3A-3C illustrate diagrams related to delay circuitry in accordance with implementations described herein.
Figure 3B:
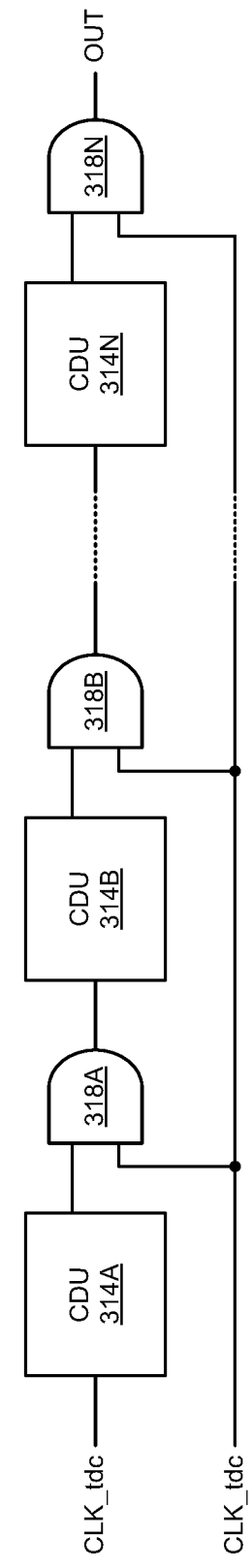
Figure 3C:
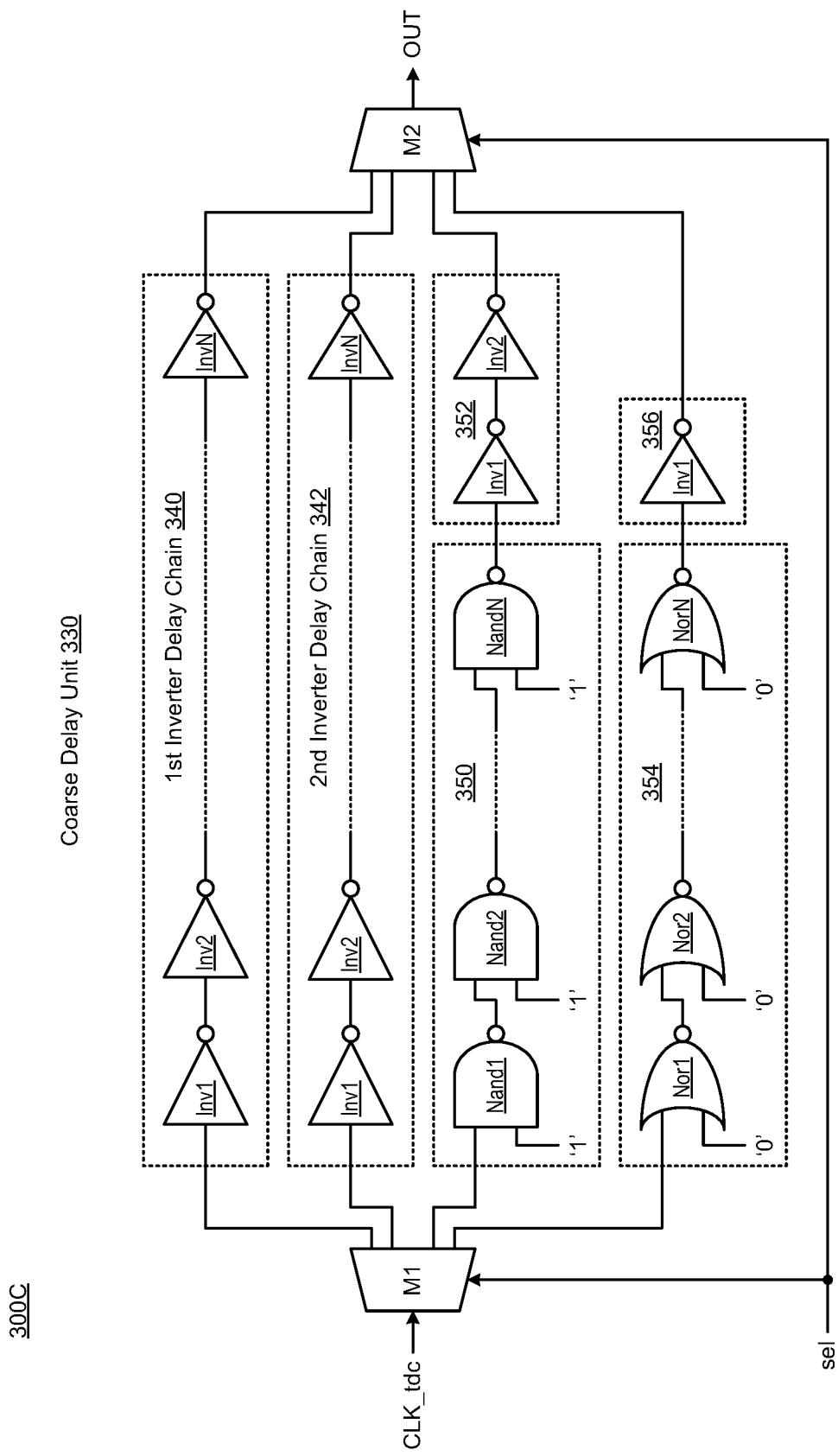

FIGS. 3A-3C illustrate diagrams related to delay circuitry in accordance with implementations described herein. In particular, FIG. 3A illustrates a diagram 300A of fine delay circuitry 302, FIG. 3B illustrates a diagram 300B of coarse delay circuitry 304, and FIG. 3C illustrates a diagram 300C of a coarse delay unit 330.

The fine delay circuitry 302 may be implemented as the one or more fine delays 224A, 224B (T fine) in FIG. 2A. As shown in FIG. 3A, the fine delay circuitry 302 is a cell or device that has multiple logic gates 310, 312 that are coupled together to receive the sampling clock signal (CLK_tdc), receive the modified clock signal (NCLK_tdc) from the coarse delay 220, and provide the differential timing signals (dts_1, dts_2) as a low voltage output (OUTN) and a high voltage output (OUT). The modified clock signal (mcs) may refer to an inverted clock signal (NCLK_tdc). Also, in some instances, the fine delay circuitry 302 may receive an input signal (IN) as a propagation blocking input, which may be needed to avoid aliasing when the TDC propagation delay is longer than the sampling period. This may happen when the TDC 140 works outside of the operating region of the CPU subsystem 160 at low supply voltage (Vdd).

The coarse delay circuitry 304 may be implemented as the one or more coarse delays 220 (T_coarse) in FIG. 2A. As shown in FIG. 3B, the coarse delay circuitry 304 is a cell or device that has multiple coarse delay units (CDU) 314A, 314B, . . . 314N that are coupled in series with multiple logic gates 318A, 318B, . . . , 318N. The coarse delay units (CDU) 314A, 314B, . . . 314N are shown in FIG. 3C, and the multiple logic gates 318A, 318B, . . . , 318N may be implemented with AND gates, or similar. In some instances, a first CDU 314A may receive the sampling clock signal (CLK_tdc) and provide an output signal to a first logic gate 318A. The first logic gate 318A may receive the output signal from the CDU 314A, receive the sampling clock signal (CLK_tdc), and provide an output signal to a second (or next) CDU 314B. The second CDU 314B may receive the output signal from the first (or previous) CDU 314A and provide an output signal to a last (or next) logic gate 318N. The last logic gate 318N may receive the output signal from the second (or previous) CDU 314B, receive the sampling clock signal (CLK_tdc), and provide a coarse delay output signal (OUT). In various implementations, the coarse delay circuitry 304 may include any number (N) of coarse delay units (CDUs) 314A, 314B, . . . , 314N and any number (N) of logic gates 318A, 318B, . . . , 318N.

The coarse delay unit 330 may be implemented as coarse delay units (CDUs) 314A, 314B, . . . , 314N in FIG. 3B. As shown in FIG. 3C, the coarse delay unit 330 is a cell or device having multiple logic delay chains 340, 342, 350, 352, 354, 356 coupled between an input multiplexer (M1) and an output multiplexer (M2). In some instances, a first inverter delay chain 340 may include any number (N) of inverters Inv1, Inv2, . . . , InvN (e.g., N=8) coupled together in series between the multiplexers (M1, M2). Also, a second inverter delay chain 342 may include any number (N) of inverters Inv1, Inv2, . . . , InvN (e.g., N=5) coupled together in series between the multiplexers (M1, M2). Also, a first logic gate delay chain 350 may be coupled in series with a third inverter delay chain 352 between the multiplexers (M1, M2), and also, a second logic gate delay chain 354 may be coupled in series with a fourth inverter delay chain 356 between the multiplexers (M1, M2). In some instances, the first logic gate delay chain 350 may include any number (N) of logic gates (e.g., NAND gates: Nand1, Nand2, . . . , NandN, where N=5) coupled together in series, and third inverter delay chain 352 may include one or more inverters (e.g., Inv1, Inv2, where N=2) coupled together in series. As shown, a logic one ('1') may be provided as another input to each of the logic gates (Nand1, Nand2, . . . , NandN) in the first logic gate delay chain 350. Also, in some instances, the second logic gate delay chain 354 may include any number (N) of logic gates (e.g., NOR gates: Nor1, Nor2, . . . , NorN, where N=5) coupled together in series, and fourth inverter delay chain 356 may include one or more inverters (e.g., Inv1, where N=1) coupled together in series. As shown, a logic zero ('0') may be provided as another input to each of the logic gates (Nor1, Nor2, . . . , NorN) in the second logic gate delay chain 354.

Also, as shown in FIG. 3C, the first multiplexer (M1) may be implemented as a 1-to-4 multiplexer that receives the sampling clock signal (CLK_tdc) from the modulator (MOD 122) and provides the sampling clock signal (CLK_tdc) to at least one of the logic delay chains 340, 342, 350/352, 354/356 based on a selection signal (sel). In addition, the second multiplexer (M2) may be implemented as a 4-to-1 multiplexer that receives a modified clock signal (mcs) from at least one of the logic delay chains 340, 342, 350/352, 354/356 and provides an output signal (OUT) based on the selection signal (sel). The modified clock signal (mcs) may be a delayed and/or inverted clock that is based on and/or associated with the sampling clock signal (CLK_tdc). In some implementations, the first multiplexer (M1) may be implemented as a 1-to-4 multiplexer coupled to the logic chains 340, 342, 350/352, 354/356. However, in other implementations, the first multiplexer (M1) may be implemented with any type of multiplexer, such as, e.g., 1-to-3 multiplexer, 1-to-5 multiplexer, or any other type of multiplexer coupled to any number of logic chains. Also, the second multiplexer (M2) may be referred to as an output demultiplexer, and in some implementations, the second multiplexer (M2) may be implemented as a 4-to-1 multiplexer coupled to the logic chains 340, 342, 350/352, 354/356. However, in other implementations, the second multiplexer (M2) may be implemented with any type of multiplexer, such as, e.g., 3-to-1 multiplexer, 5-to-1 multiplexer, or any other type of multiplexer coupled to any number of logic chains.

In reference to time aliasing issues and time aliasing blocking, the coarse delay unit 330 in FIG. 3C of the TDC delay line may include multiple coarse delay units (e.g., 24 coarse delay units) that are using a similar architecture as the delay units of the ring-oscillator (TCRO 150) that clocks the CPU 160. The schematic of the coarse delay unit 330 and the coarse delay block 220, 314A, 314B, . . . , 314N may be used for blocking the propagation of the clock signal (CLK_tdc) just at the end of the coarse delay block (e.g., with 24 CDU). In some instances, at least one propagation blocker cell may be coupled between each coarse delay unit 314A, 314B, . . . , 314N, and also, the propagation blocker may be implemented with one or more logic gates, such as, e.g., one or more AND gates 318A, 318B, . . . , 318N as shown in FIG. 3B.

Figure 4A:
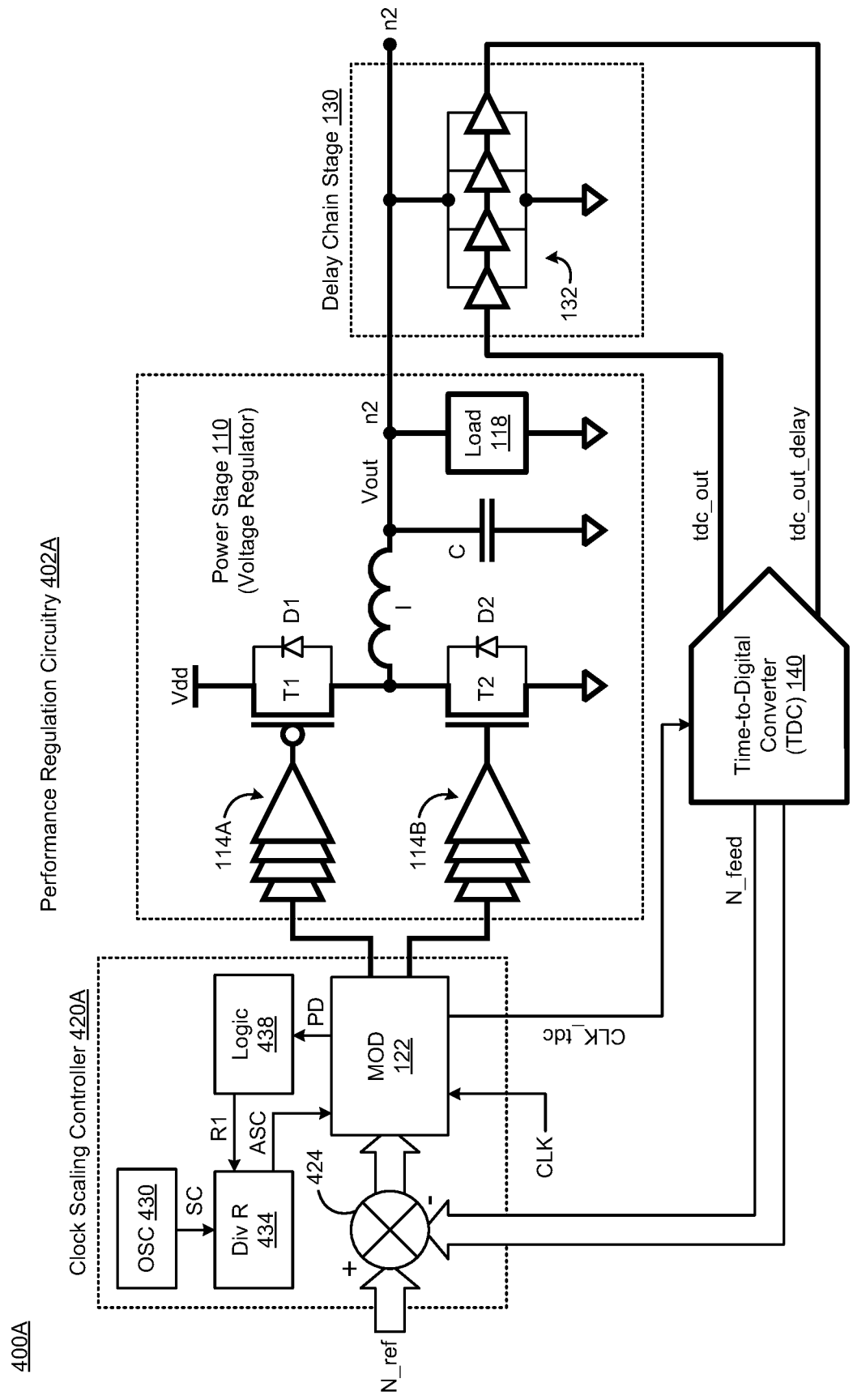
FIGS. 4A-4B illustrate diagrams of performance regulation circuitry in accordance with implementations described herein.
Figure 4B:
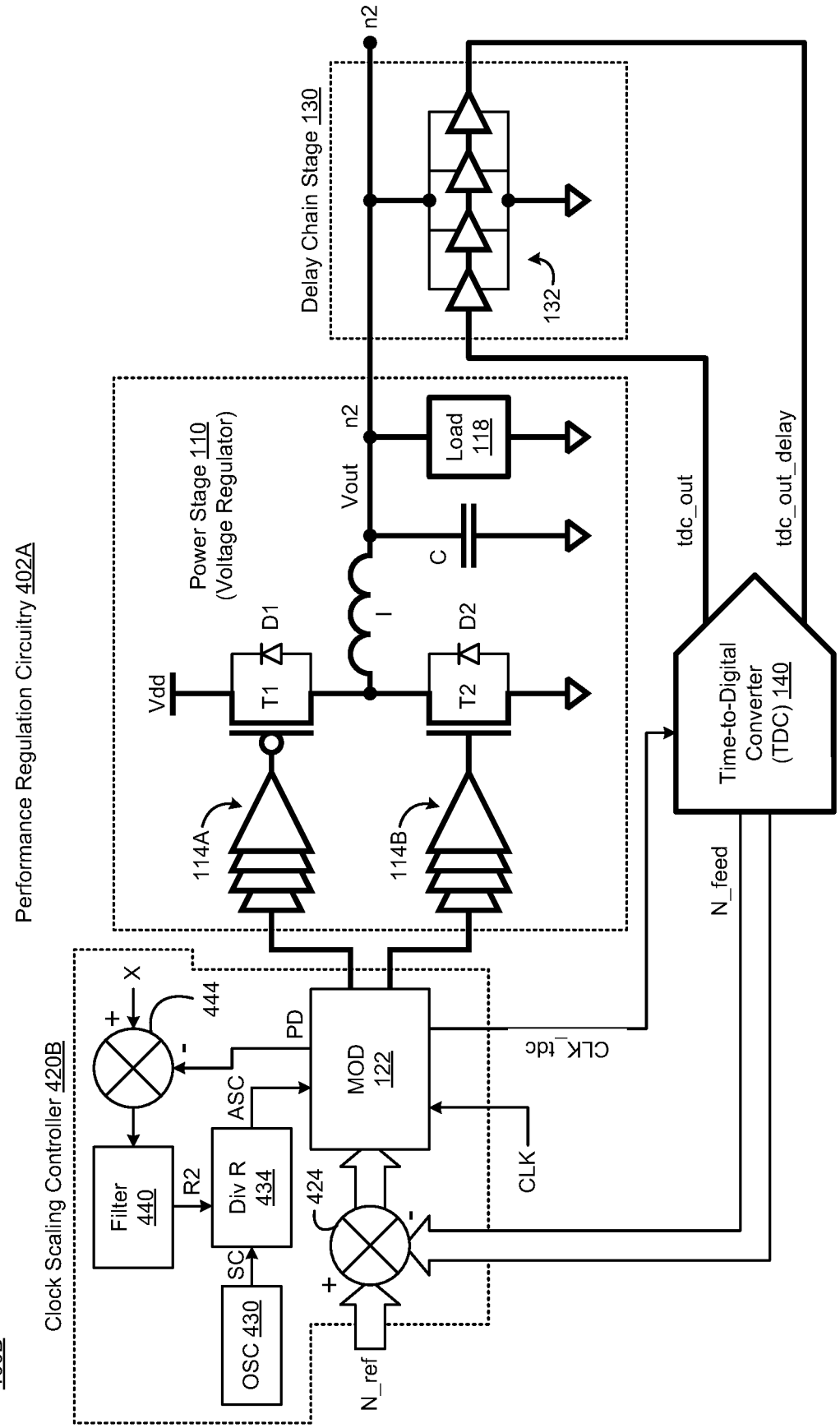

FIGS. 4A-4B illustrate various diagrams of performance regulation circuitry in accordance with implementations described herein. In particular, FIG. 4A illustrates a diagram 400A of performance regulation circuitry 402A having a clock scaling controller 420A, and FIG. 4B illustrates a diagram 400B of performance regulation circuitry 402B having another clock scaling controller 420B. Various stages and components associated therewith that are shown in FIGS. 4A-4B have similar is scope, operation and function as similar components shown in FIG. 1A.

As shown in reference to FIG. 4A, the performance regulation circuitry 402A refers to a device having multiple components, including, e.g., the power stage 110 (or voltage regulator), the delay chain stage 130, the time-to-digital converter (TDC) 140, and the clock scaling controller 420A. As described herein, the power stage 110 (or voltage regulator) may be configured to receive and utilize a modulated control signal from the modulator (MOD 122) to adjust the output voltage (Vout) provided to the load 118. Also, as described herein, the TDC 140 may be configured to determine a timing delay error that is associated with the output voltage (Vout) and provide the timing delay error to the modulator (MOD 122) as the feedback signal (N_feed).

The clock scaling controller 420A may be configured to receive the feedback signal (N_feed) from the TDC 140, use the modulator (MOD 122) to generate the modulated control signal based on the feedback signal (N_feed), analyze behavior of the feedback signal (N_feed) so as to adjust the modulated control signal, and provide the modulated control signal to the voltage regulator 110 to thereby adjust the output voltage (Vout) provided to the load 118. As shown in FIG. 4A, the clock scaling controller 420A may include an oscillator (OSC 430) that provides a sampling clock (SC) for sampling the feedback signal (N_feed). The clock scaling controller 420A may include a logic circuit 438 that receives the modulated control signal from the modulator (MOD 122) and tracks pulse density (PD) of the modulated control signal.

In some implementations, the clock scaling controller 420A may include a clock divider (Div R 433) that receives the sampling clock (SC) from the oscillator (OSC 430), receives the pulse density (PD) from the logic circuit 438 as a reference signal (R1), adjusts the sampling clock (SC) based on the pulse density (PD), and then provides an adjusted sampling clock (ASC) to the modulator (MOD 122). Also, as shown, the clock scaling controller 420A may include the modulator (MOD 122) that receives the feedback signal (N_feed) from the TDC 140, receives the adjusted sampling clock (ASC) from the clock divider (Div R 434), and then generates the modulated control signal based on the feedback signal (N_feed) and the adjusted sampling clock (ASC).

In some implementations, the clock scaling controller 420A may be configured to analyze behavior of the feedback signal (N_feed) with adaptive clock scaling (ACS) by sampling the feedback signal using the sampling clock (SC), tracking pulse density (PD) of the feedback signal (N_feed), and adjusting the sampling clock (SC) so as to adjust the modulated control signal. In some instances, if the pulse density (PD) is less than a predetermined value, then the clock divider (Div R 434) is incremented, and the clock divider (Div R 434) decreases the sampling clock (SC) to thereby reduce power of the modulated control signal and reduce the output voltage (Vout). In other instances, if the pulse density (PD) is greater than the predetermined value, then the clock divider (Div R 434) is decremented, and the clock divider (Div R 434) increases the sampling clock (SC) to boost power of the modulated control signal and boost the output voltage (Vout).

As shown in reference to FIG. 4B, the performance regulation circuitry 402B refers to a device having the power stage 110 (or voltage regulator), the delay chain stage 130, the time-to-digital converter (TDC) 140, and the clock scaling controller 420B. As described herein, the power stage 110 (or voltage regulator stage) may be configured to receive and use a modulated control signal from the modulator (MOD 122) to adjust the output voltage (Vout) provided to the load 118. Also, the TDC 140 may be configured to determine a timing delay error associated with the output voltage (Vout) and provide the timing delay error to the modulator (MOD 122) as the feedback signal (N_feed).

In some implementations, the clock scaling controller 420B may be configured to receive the feedback signal (N_feed) from the TDC 140, use the modulator (MOD 122) to generate the modulated control signal based on the feedback signal (N_feed), analyze behavior of the feedback signal (N_feed) so as to adjust the modulated control signal, and provide the modulated control signal to the voltage regulator 110 to thereby adjust the output voltage (Vout) provided to the load 118. In FIG. 4B, the performance regulation circuitry 402B may include the oscillator (OSC 430) that provides the sampling clock (SC) for sampling the feedback signal (N_feed). In some instances, the performance regulation circuitry 402B may include a filter circuit 440 that receives the modulated control signal, determines the pulse density (PD) of the modulated control signal, compares the pulse density (PD) with a reference value (X) so as to identify an error, and provides a regulated control signal (R2) based on the error.

In some implementations, the performance regulation circuitry 402B includes a clock divider (Div R) that receives the sampling clock (SC) from the oscillator (OSC 430), receives the regulated control signal (R2) from the filter circuit 440, adjusts the sampling clock (SC) based on the pulse density (PD), and provides the adjusted sampling clock (ASC). Also, the performance regulation circuitry 402B may include the modulator (MOD 122) that receives the feedback signal (N_feed) from the TDC 140, receives the adjusted sampling clock (ASC) from the clock divider (Div R 434), and generates the modulated control signal based on the feedback signal (N_feed) and the adjusted sampling clock (ASC). The clock scaling controller 420B may be configured to analyze behavior of the feedback signal (N_feed) with regulated clock scaling (RCS) by determining pulse density (PD) of the modulated control signal, regulating a scaling ratio to the reference value (X), comparing the pulse density (PD) with the reference value (X) so as to identify an error, providing a regulated control signal (R2) based on the error, and adjusting the modulated control signal based on the regulated control signal (R2).

In reference to clock-scaling and automatic clock scaling of DC/DC conversion by the voltage regulator 110, the quiescent power dissipated by the voltage regulator 110 may be concentrated in the clock generation that feeds the TDC 140. The power-switches (e.g., T1, T2) may be maintained in high-impedance mode until the TDC 140 measures a propagation delay that is longer than the time reference. Such a condition occurs when the output voltage (Vout) is too low, and in this instance, the voltage regulator 110 may generate a conduction pattern by turning the high side power-switch On, until the inductor current reaches a peak value, and then turning the low-side power switch On, until the inductor current reaches OA, and then last returning to high impedance mode.

In some implementations, the decrease rate of the output voltage (Vout) may refer to discharge of the output capacitor (C: C_out) by the load current (I_load of the load 118) so that:

$$\frac{dV_{out}}{dt} = \frac{i_{load}}{C_{out}}$$

The output decoupling capacitor is known by design, and a large value may help to keep a ripple low, while the load current (I_load of the load 118) may be maximized knowing the application. On the other hand, the amount of charge absorbed by the output capacitor (C: C_out) during an operating pattern may be:

$$Q_{pattern} = \frac{I_{pk}}{2}(T_{high} + T_{low})$$

The voltage regulator 110 may only deliver one pattern per TDC-clock cycles, and the output current of the voltage regulator 110 may be bounded by:

$$I_{load} = \frac{\Delta Q_{pattern}}{\Delta T_{tdc-clk}} = \frac{I_{pk}}{2T_{clk-tdc}}(T_{high} + T_{low})$$

During the design phase, Ipk, and Tclk–Ttdc may be optimized in that increasing Ipk may increase the output ripple for a given output capacitor (C: C_out) but helps reduce the TDC clock frequency. Also, other considerations may lead to voluntarily keeping the TDC clock frequency higher than a maximum output current provides. This design step may be performed for the maximum output current; however, currents 10 or 100 times lower than the maximum output current may be possible and may lead to a TDC clock that is one or two order or magnitude higher than necessary. In this instance, power consumption of the TDC 140 may be mainly dependent on the TDC operating clock along with the quiescent current of the entire control circuit. Therefore, reducing the quiescent power of the control circuit may be achieved by reducing the TDC clock when the load current is low. This may lead to a significant efficiency increase of the system.

Described herein are various implementations of a device. The device may include a voltage regulator that uses a modulator to adjust an output voltage. The device may include a time-to-digital converter that measures a timing delay of a logic chain, compares the timing delay to a reference delay to determine a timing delay error, and provides the timing delay error to the modulator for adjusting the output voltage.

Described herein are various implementations of a device. The device may include delay circuitry that receives a clock signal and provides differential timing signals. The device may include latching circuitry that receives the differential timing signals from the delay circuitry and provides pulse sensing signals when activated. The device may include logic circuitry that receives the pulse sensing signals from the latching circuitry and provides an output signal as a timing delay error.

Described herein are various implementations of a device. The device may include a voltage regulator that receives and uses a modulated control signal to adjust an output voltage provided to a load. The device may include a time-to-digital converter that determines a timing delay error associated with the output voltage and provides the timing delay error as a feedback signal. The device may include a clock scaling controller that receives the feedback signal from the time-to-digital converter, generates the modulated control signal based on the feedback signal, analyzes behavior of the feedback signal so as to adjust the modulated control signal, and provides the modulated control signal to the voltage regulator to thereby adjust the output voltage provided to the load.

Described herein are various implementations of a method. The method may include adjusting an output voltage with a voltage regulator and a modulator. The method may include measuring a timing delay of a logic chain with a time-to-digital converter. The method may include comparing the timing delay to a reference delay to determine a timing delay error with the time-to-digital converter. The method may include providing the timing delay error to the modulator for adjusting the output voltage with the time-to-digital converter.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   a voltage regulator that uses a modulator to adjust an output voltage;
   a logic chain having multiple inverters coupled in series between a single input and a single output; and
   a time-to-digital converter that measures a timing delay of the logic chain via the single input and the single output, compares the timing delay to a reference delay to determine a timing delay error, and provides the timing delay error to the modulator for adjusting the output voltage.

2. The device of claim 1, wherein the time-to-digital converter measures the timing delay of the logic chain at periodic timing intervals, and wherein the logic chain senses process variation of circuit components associated with the device.

3. The device of claim 1, wherein the logic chain comprises an inverter logic chain that provides for determining performance of a load.

4. The device of claim 3, wherein the voltage regulator is coupled to the load so as to provide and regulate supply voltage of the load, and wherein the voltage regulator comprises a DC-to-DC voltage regulator.

5. A device, comprising:
a voltage regulator that uses a modulator to adjust an output voltage; and
a time-to-digital converter that measures a timing delay of a logic chain, compares the timing delay to a reference delay to determine a timing delay error, and provides the timing delay error to the modulator for adjusting the output voltage, wherein:
if the timing delay error is greater than a predetermined interval, then the time-to-digital converter provides the timing delay error to the modulator to increase the output voltage, and
if the timing delay error is less than the predetermined interval, then the time-to-digital converter provides the timing delay error to the modulator to decrease the output voltage.

6. A device, comprising:
a voltage regulator that uses a modulator to adjust an output voltage; and
a time-to-digital converter that measures a timing delay of a logic chain, compares the timing delay to a reference delay to determine a timing delay error, and provides the timing delay error to the modulator for adjusting the output voltage, wherein:
the time-to-digital converter provides the timing delay error as a feedback signal to the modulator for adjusting the output voltage based on the timing delay error, and
if the timing delay error is greater than a predetermined interval, then the time-to-digital converter provides the feedback signal to the modulator to increase the output voltage.

7. The device of claim 6, wherein the modulator uses combinational logic to compare the feedback signal to a reference signal and determine a difference between the feedback signal and the reference signal.

8. A device, comprising:
delay circuitry that receives a clock signal, receives a timing delay signal from a logic chain, and provides differential timing signals;
latching circuitry that receives the differential timing signals from the delay circuitry and provides pulse sensing signals when activated; and
logic circuitry that receives the pulse sensing signals from the latching circuitry and provides an output signal as a timing delay error.

9. The device of claim 8, wherein the delay circuitry is coupled to the logic chain so as to receive the timing delay signal from the logic chain as a timing delay associated with performance of the logic chain.

10. The device of claim 9, wherein the delay circuitry has a coarse delay that receives the clock signal, receives the timing delay signal, and provides a modified clock signal having a shorter pulse width.

11. The device of claim 10, wherein the delay circuitry has a fine delay that receives the clock signal, receives the modified clock signal having a shorter pulse width from the coarse delay, and provides the differential timing signals to the latching circuitry.

12. The device of claim 11, wherein the fine delay has multiple logic gates that are coupled together to receive the clock signal, receive the modified clock signal from the coarse delay, and provide the differential timing signals as a low voltage output and a high voltage output.

13. The device of claim 8, wherein the device comprises a time-to-digital converter that receives a timing delay signal from a logic chain, measures a timing delay of the logic chain based on the timing delay signal, and provides the timing delay error to a modulator for adjusting an output voltage from a voltage regulator, and wherein the output signal is used to trigger a conduction pattern for the voltage regulator when the timing delay error is positive.

14. A device, comprising:
delay circuitry that receives a clock signal and provides differential timing signals;
latching circuitry that receives the differential timing signals from the delay circuitry and provides pulse sensing signals when activated;
logic circuitry that receives the pulse sensing signals from the latching circuitry and provides an output signal as a timing delay error; and
triggering circuitry that receives the clock signal and activates the latching circuitry by providing a timing reference signal to a power supply input of the latching circuitry,
wherein the latching circuitry has one or more latch based sense amplifiers that receive the differential timing signals from the delay circuitry and provide the pulse sensing signals when activated.

15. A device, comprising:
delay circuitry that receives a clock signal and provides differential timing signals;
latching circuitry that receives the differential timing signals from the delay circuitry and provides pulse sensing signals when activated; and
logic circuitry that receives the pulse sensing signals from the latching circuitry and provides an output signal as a timing delay error;
wherein when the clock signal is low, propagation of the clock signal through the device is blocked and the differential timing signals from the delay circuitry are forced to a logic-low state.

16. A device, comprising:
a voltage regulator that receives and uses a modulated control signal to adjust an output voltage provided to a load;
a time-to-digital converter that determines a timing delay error associated with the output voltage and provides the timing delay error as a feedback signal; and
a clock scaling controller that receives the feedback signal from the time-to-digital converter, generates the modulated control signal based on the feedback signal, analyzes behavior of the feedback signal with regulated clock scaling so as to adjust the modulated control signal, and provides the modulated control signal to the voltage regulator to thereby adjust the output voltage provided to the load.

17. The device of claim 16, wherein the clock scaling controller analyzes the behavior of the feedback signal with the regulated clock scaling by:
determining pulse density of the modulated control signal,
regulating a scaling ratio to a reference value,
comparing the pulse density with the reference value so as to identify an error,
providing a regulated control signal based on the error, and
adjusting the modulated control signal based on the regulated control signal.

18. A device, comprising:
a voltage regulator that receives and uses a modulated control signal to adjust an output voltage provided to a load;
a time-to-digital converter that determines a timing delay error associated with the output voltage and provides the timing delay error as a feedback signal; and
a clock scaling controller that receives the feedback signal from the time-to-digital converter, generates the modulated control signal based on the feedback signal, analyzes behavior of the feedback signal so as to adjust the modulated control signal, and provides the modulated control signal to the voltage regulator to thereby adjust the output voltage provided to the load, wherein the clock scaling controller comprises:
an oscillator that provides a sampling clock for sampling the feedback signal;
a logic circuit that receives the modulated control signal and tracks pulse density of the modulated control signal;
a clock divider that receives the sampling clock from the oscillator, receives the pulse density from the logic circuit, adjusts the sampling clock based on the pulse density, and provides the adjusted sampling clock; and
a modulator that receives the feedback signal from the time-to-digital converter, receives the adjusted sampling clock from the clock divider, and generates the modulated control signal based on the feedback signal and the adjusted sampling clock.

19. A device, comprising:
a voltage regulator that receives and uses a modulated control signal to adjust an output voltage provided to a load;
a time-to-digital converter that determines a timing delay error associated with the output voltage and provides the timing delay error as a feedback signal; and
a clock scaling controller that receives the feedback signal from the time-to-digital converter, generates the modulated control signal based on the feedback signal, analyzes behavior of the feedback signal so as to adjust the modulated control signal, and provides the modulated control signal to the voltage regulator to thereby adjust the output voltage provided to the load,
wherein the clock scaling controller analyzes behavior of the feedback signal with adaptive clock scaling by sampling the feedback signal using a sampling clock, tracking pulse density of the feedback signal, and adjusting the sampling clock so as to adjust the modulated control signal, and wherein:
if the pulse density is less than a predetermined value, then the clock divider is incremented, and the clock divider decreases the sampling clock to reduce power of the modulated control signal and reduce the output voltage, and
if the pulse density is greater than the predetermined value, then the clock divider is decremented, and the clock divider increases the sampling clock to boost power of the modulated control signal and boost the output voltage.

20. A device, comprising:
a voltage regulator that receives and uses a modulated control signal to adjust an output voltage provided to a load;
a time-to-digital converter that determines a timing delay error associated with the output voltage and provides the timing delay error as a feedback signal; and
a clock scaling controller that receives the feedback signal from the time-to-digital converter, generates the modulated control signal based on the feedback signal, analyzes behavior of the feedback signal so as to adjust the modulated control signal, and provides the modulated control signal to the voltage regulator to thereby adjust the output voltage provided to the load, wherein the clock scaling controller comprises:
an oscillator that provides a sampling clock for sampling the feedback signal;
a filter circuit that receives the modulated control signal, determines pulse density of the modulated control signal, compares the pulse density with a reference value so as to identify an error, and provides a regulated control signal based on the error;
a clock divider that receives the sampling clock from the oscillator, receives the regulated control signal from the filter circuit, adjusts the sampling clock based on the pulse density, and provides the adjusted sampling clock; and
a modulator that receives the feedback signal from the time-to-digital converter, receives the adjusted sampling clock from the clock divider, and generates the modulated control signal based on the feedback signal and the adjusted sampling clock.

21. A method, comprising:
adjusting an output voltage with a voltage regulator and a modulator;
measuring a timing delay of a logic chain with a time-to-digital converter, wherein the logic chain has multiple inverters coupled in series between a single input and a single output and wherein the timing delay of the logic chain is measured by the time-to-digital converter via the single input and the single output of the logic chain;
comparing the timing delay to a reference delay to determine a timing delay error with the time-to-digital converter; and
providing the timing delay error to the modulator for adjusting the output voltage with the time-to-digital converter.

22. The method of claim 21, wherein the time-to-digital converter measures the timing delay of the logic chain at periodic timing intervals, and wherein the logic chain senses process variation of circuit components associated with the device.

23. The method of claim 21, wherein the logic chain comprises an inverter logic chain that provides for determining performance of a load, and wherein the voltage regulator is coupled to the load so as to provide and regulate supply voltage of the load.

24. A method, comprising:
adjusting an output voltage with a voltage regulator and a modulator;
measuring a timing delay of a logic chain with a time-to-digital converter;
comparing the timing delay to a reference delay to determine a timing delay error with the time-to-digital converter; and
providing the timing delay error to the modulator for adjusting the output voltage with the time-to-digital converter, wherein:
if the timing delay error is greater than a predetermined interval, then the time-to-digital converter provides the timing delay error to the modulator to increase the output voltage, and if the timing delay error is less than the predetermined interval, then the time-to-digital converter provides the timing delay error to the modulator to decrease the output voltage.

25. A method, comprising:

adjusting an output voltage with a voltage regulator and a modulator;

measuring a timing delay of a logic chain with a time-to-digital converter;

comparing the timing delay to a reference delay to determine a timing delay error with the time-to-digital converter; and providing the timing delay error to the modulator for adjusting the output voltage with the time-to-digital converter, wherein the time-to-digital converter provides the timing delay error as a feedback signal to the modulator for adjusting the output voltage based on the timing delay error, and wherein the modulator uses combinational logic to compare the feedback signal to a reference signal and determine a difference between the feedback signal and the reference signal.

* * * * *